(12) United States Patent
Li et al.

(10) Patent No.: US 6,351,168 B1
(45) Date of Patent: Feb. 26, 2002

(54) PHASE ALIGNMENT SYSTEM

(75) Inventors: Gabriel Li, San Francisco; Paul H. Scott, San Jose, both of CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/533,198

(22) Filed: Mar. 23, 2000

(51) Int. Cl.[7] .................................................. H03L 7/00
(52) U.S. Cl. .......................... 327/160; 327/241; 327/242
(58) Field of Search ................................. 327/100, 141, 327/160, 237, 241, 242

(56) References Cited

U.S. PATENT DOCUMENTS

| 4,504,862 A | * | 3/1985 | Achstaetter | 327/41 |
| 4,908,582 A | * | 3/1990 | Kawano et al. | 327/113 |
| 5,049,766 A | * | 9/1991 | Van Driest et al. | 327/269 |
| 5,825,226 A | | 10/1998 | Ferraiolo et al. | 327/250 |
| 5,875,219 A | | 2/1999 | Kim | 375/376 |
| 6,054,887 A | * | 4/2000 | Horie et al. | 327/307 |

OTHER PUBLICATIONS

RoboClock II™ CY7B994V/CY7B993V, High-Speed Multi-Phase PLL Clock Buffer, Cypress Semiconductor Corporation, Jun. 13, 2000, pp. 1–14.

* cited by examiner

Primary Examiner—Kenneth B. Wells
(74) Attorney, Agent, or Firm—Christopher P. Maiorana, P.C.

(57) ABSTRACT

A circuit including a counter, a state machine and an update circuit. The counter may be configured to present a first control signal and a second control signal in response to a reset signal and a third control signal. The state machine may be configured to generate a select signal in response to (i) the reset signal, (ii) the first control signal and (iii) the second control signal. The update circuit may be configured to generate a fourth control signal in response to the select signal.

20 Claims, 5 Drawing Sheets

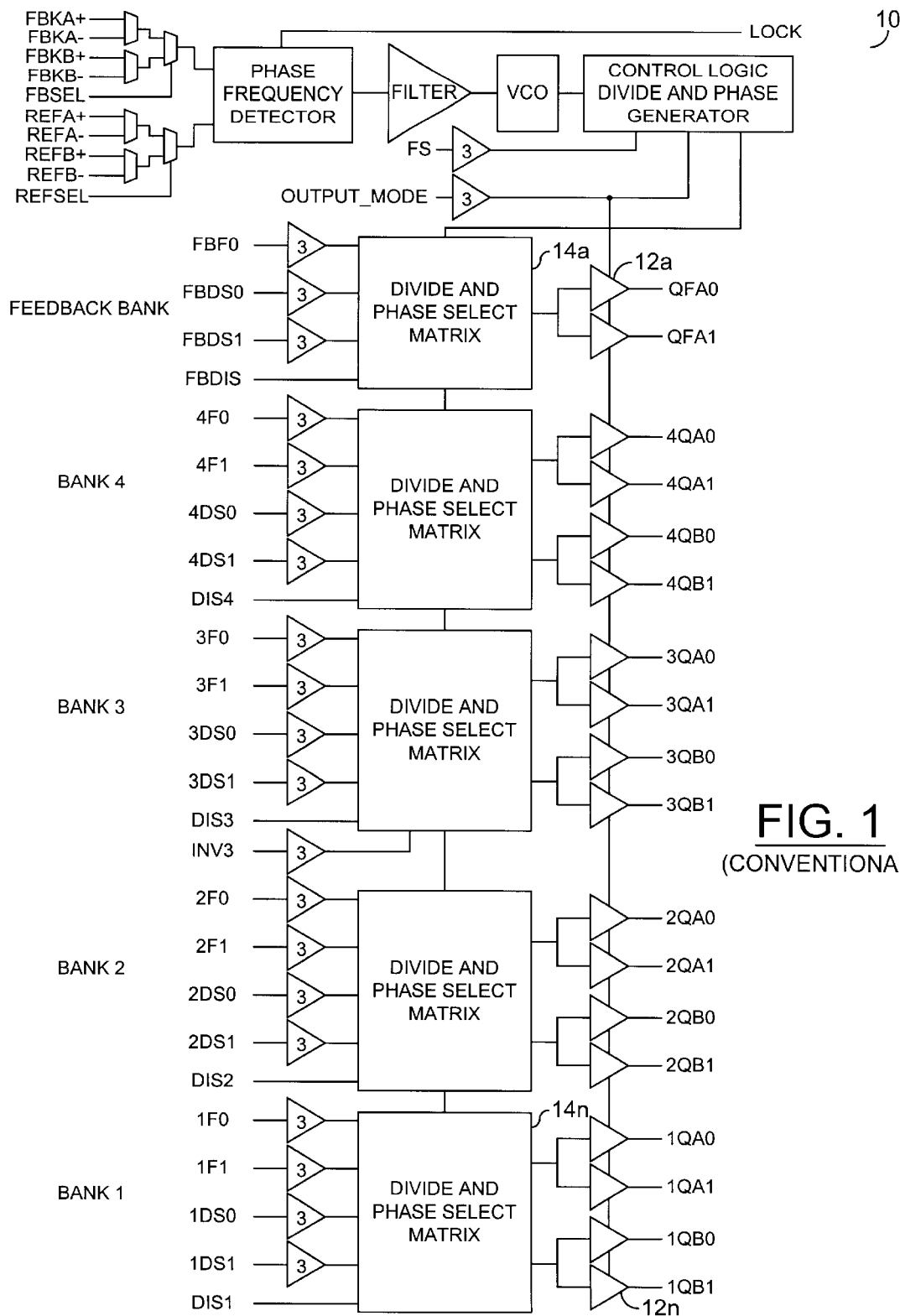
FIG. 1
(CONVENTIONAL)

US 6,351,168 B1

PHASE ALIGNMENT SYSTEM

FIELD OF THE INVENTION

The present invention relates to a method and/or architecture for phase alignment generally and, more particularly, to a method and/or architecture for phase alignment of two clock signals to within a predetermined skew.

BACKGROUND OF THE INVENTION

Some conventional methods for phase alignment consist of PLLs (e.g., High-Speed Multi-Phase PLL clock buffers). The PLLs consume additional power and have an increased die size. Furthermore, conventional methods have a limited skew.

Referring to FIG. 1 a conventional circuit 10 for phase alignment is shown. The conventional circuit 10 implements high-speed multi-phase PLL clock buffers to offer user-selectable control over system clock functions. A multiple-output clock driver provides the system integrator with functions necessary to optimize the timing of high-performance computer and communication systems.

Eighteen configurable outputs 12a–12n each drive terminated transmission lines, while delivering minimal and specified output skews at LVTTL levels. The outputs are arranged in five banks 14a–14n. Banks 14a–14 (n−1) each allow a divide function of 1 to 12, while simultaneously allowing phase adjustments in 625 ps–1300 ps increments up to 10.4 ns. One of the output banks 14a–14 (n−1) also includes an independent clock invert function. The feedback bank 14n consists of two outputs, which allows divide-by functionality from 1 to 12 and limited phase adjustments. Any one of the eighteen outputs 12a–12n can be connected to the feedback input as well as driving other inputs.

SUMMARY OF THE INVENTION

One aspect of the present invention concerns an apparatus comprising a clock circuit and a control circuit. The clock circuit may be configured to generate a first output clock, a second output clock and a first control signal in response to (i) a first input clock, (ii) a second input clock, (iii) a second control signal and (iv) a third control signal. The control circuit may be configured to generate the second control signal and the third control signal in response to the first input clock and the first control signal. The first and second output clocks may have a skew less than a predetermined threshold.

Another aspect of the present invention concerns a circuit comprising a counter, a state machine and an update circuit, The counter may be configured to present a first control signal and a second control signal in response to a reset signal and a third control signal. The state machine may be configured to generate a select signal in response to (i) the reset signal, (ii) the first control signal and (iii) the second control signal. The update circuit may be configured to generate a fourth control signal in response to the select signal.

The objects, features and advantages of the present invention include providing a method and/or architecture for phase alignment of two signals that may provide (i) a simplistic and purely digital logic design to align the two signals within a predetermined skew, (ii) the ability to shift a phase of a reference clock using metal fuses and/or programmable registers that may allow change of (a) data setup and/or (b) hold time in high speed communication systems, (iii) a digital phase alignment system and/or (iv) an updatable configuration method.

BRIEF DESCRIPTION OF THE DRAWINGS

These and other objects, features and advantages of the present invention will be apparent from the following detailed description and the appended claims and drawings in which:

FIG. 1 is a block diagram of a conventional method for phase alignment;

Detailed Description of the Preferred Embodiments

Figure 2:
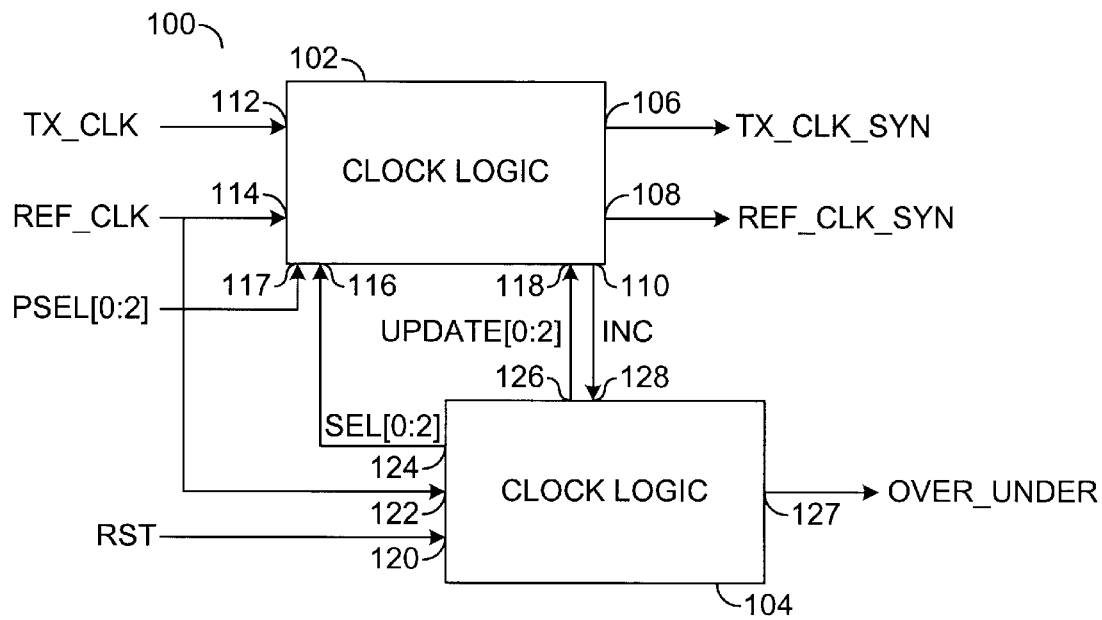
FIG. 2 is a block diagram of a preferred embodiment of the present invention.

Referring to FIG. 2, a block diagram of a circuit 100 is shown in accordance with a preferred embodiment of the present invention. The structure of the circuit 100 generally comprises a clock logic block (or circuit) 102 and a control logic block (or circuit) 104.

The circuit 100 may align two signals to within a predetermined target skew (e.g., 200 ps of skew). The circuit 100 may use digital logic to achieve the desired skew constraint. Furthermore, the circuit 100 may provide a simple and purely digital logic design. The present invention may incorporate the ability to shift a phase of an input clock. The phase shift may be controlled by metal fuses or programmable registers. The circuit 100 may allow a change of data setup and/or hold time for implementation in high speed communication systems.

The clock logic circuit 102 may have an output 106 that may present a signal (e.g., TX_CLK_SYN), an output 108 that may present a signal (e.g., REF_CLK_SYN), and an output 110 that may present a control signal (e.g., INC). In one example, the signal TX_CLK_SYN and the signal REF_CLK_SYN may be implemented as a limited skew pair. In another example, the signal INC may be implemented as an increment signal. However, the signal TX_CLK_SYN, the signal REF_CLK_SYN, and the signal INC each may be implemented as other appropriate signals in order to meet the criteria of a particular implementation.

The clock logic block 102 may have an input 112 that may receive an input clock signal (e.g., TX_CLK) and an input 114 that may receive an input clock signal (e.g., REF_CLK). In one example, the input clock signals TX_CLK and REF_CLK may be implemented as a transmit clock and a reference clock, respectively. Additionally, the clock logic block 102 may have an input 116 that may receive a control signal (e.g., SEL[0:2]), an input 117 that may receive a control signal (e.g., PSEL[0:2]) and an input 118 that may receive a control signal (e.g., UPDATE[0:2]. The control signal SEL[0:2], the control signal PSEL[0:0] and the control signal UPDATE[0:2] may be implemented as, in one example, a select signal, a programmable select and an update signal, respectively. The signals SEL[0:2], PSEL[0:2] and UPDATE[0:2] are shown as 3-bit signals for purposes of example. However, other bit-widths may be implemented accordingly to meet the design criteria of a particular implementation. In particular, the number of bits of the signals generally corresponds to the number of multiplexers within the lock logic circuit 102 (to be described in more detail in connection with FIGS. 2 and 4). The control signal may be generated by PSEL[0:2] a user programmable register (not shown).

The control logic block 104 may have an input 120 that may receive a reset signal (e.g., RST), an input 122 that may receive the signal REF_CLK, an output 124 that may present the signal SEL[0:2], an output 126 that may present the signal UPDATE [0:2], an output 127 that may present a signal (e.g., OVER_UNDER) and an input 128 that may receive the signal INC. The control logic block 104 may generate the control signal SEL[0:2], the signal UPDATE [0:2] and the signal OVER_UNDER in response to the signal INC, the signal RST and the clock REF_CLK.

Figure 3:
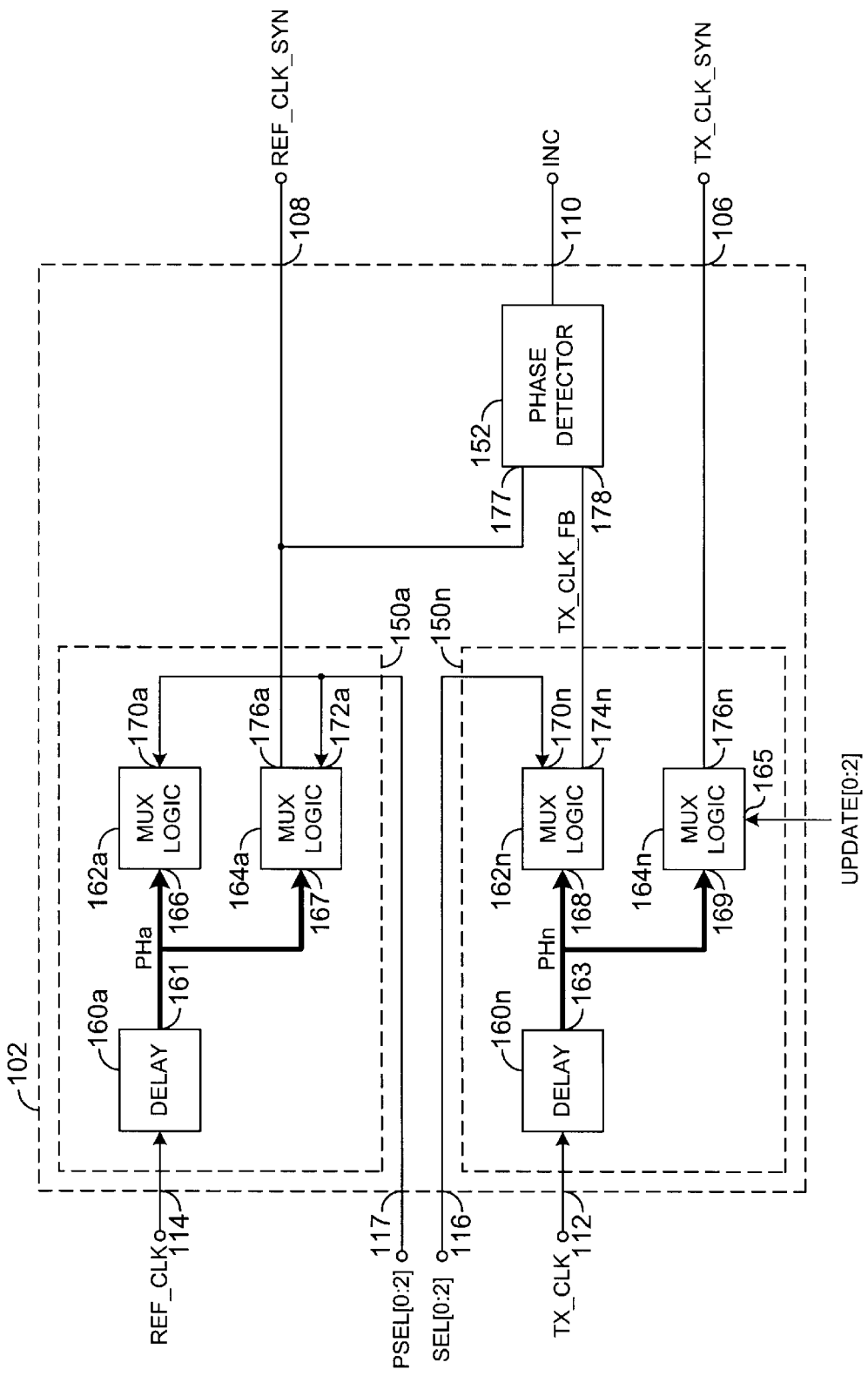
FIG. 3 is a detailed block diagram of a clock logic circuit of FIG. 2.

Referring to FIG. 3, a detailed block diagram of the clock logic circuit 102 is shown. The clock logic circuit 102 generally comprises a number of multiplexer blocks 150*a*–150*n* *a*and a phase detector block 152. The phase detector 152 may be implemented, in one example, as a high speed "D" type flop-flop (e.g., less than 50ps setup time). However, other flip-flops and/or latch combinations may be implemented accordingly to meet the design criteria of a particular implementation.

The multiplexer block 150*a* generally comprises a delay block 160*a*, a multiplexer logic block 162*a* and a multiplexer logic block 164*a*. The delay block 160*a* generally receives the signal REF_CLK from the input 114. The delay block 160*a* may be implemented as, in one example, a delay line. However, the delay block 160*a* may be implemented as another appropriate delay device in order to meet the criteria of a particular implementation. The delay block 160*a* may have an output 161 that may present a signal (e.g., PHa). In one example, the signal PHa may be implemented as a multi-bit phase signal. However, the signal PHa may be implemented as another appropriate signal in order to meet the criteria of a particular implementation. The signal PHa is generally presented to an input 166 of the multiplexer logic block 162*a* and an input 167 of the multiplexer logic block 164*a*.

The multiplexer logic block 162*a* may be implemented as a dummy load for the signal PHa. The multiplexer logic block 162*a* may have an input 170*a* that may receive the signal PSEL[0:2]. The multiplexer logic block 164*a* may have an input 172*a* that may receive the signal PSEL[0:2]. Additionally, the multiplexer logic block 164*a* may have an output 176*a* that may present the signal REF_CLK_SYN. The multiplexer logic block 164*a* may present the signal REF_CLK in response to the phase signal PHa and the signal PSEL[0:2]. The signal REF_CLK_SYN may be presented to the output 108 of the clock logic block 102.

The multiplexer block 150*n* is generally configured similar to the multiplexer block 150*a*. The delay block 160*n* may have an output 163 that may present the signal PHn. The signal PHn is generally presented to an input 168 of the multiplexer 162*n* and an input 169 of the multiplexer logic block 164*n*. The multiplexer logic block 162*n* generally has an input 170*n* that may receive the control signal SEL and an output 174*n* that may present a signal (e.g., TX_CLK_FB).

The multiplexer logic block 164*n* generally has an input 165 that may receive the signal UPDATE[0:2] and an output 176*n* that may present the signal TX_CLK_SYN. The multiplexer logic block 164*n* may generate the signal TX_CLK_SYN in response to the phase signal PHn and the control signal UPDATE[0:2]. The signal TX_CLK_SYN may be presented to the output 106 of the clock logic block 102.

The phase detector 152 may have an input 177 that may receive the signal REF_CLK_SYN and an input 178 that may receive the signal CLK. The phase detector 152 may present the control signal INC in response to the signal REF_CLK_SYN and the signal CLK.

Figure 4:
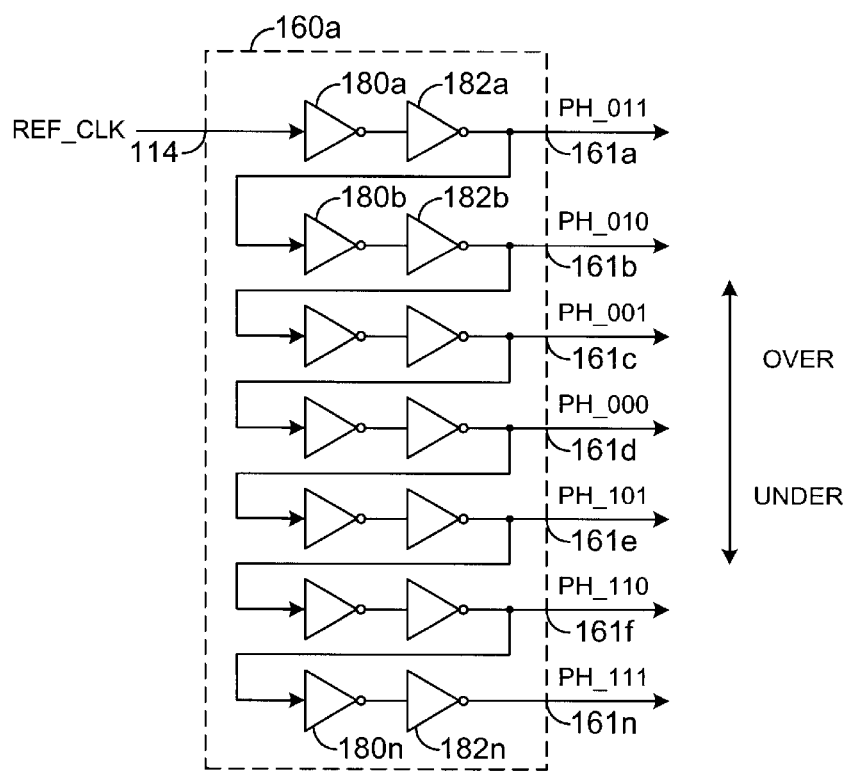
FIG. 4 is a detailed block diagram of a delay logic circuit of FIG. 3.

Referring to FIG. 4, a detailed diagram of the delay block 160*a* is shown. The additional delay blocks 160*b*–160*n* may be similar to the delay block 160*a*. The delay block 160*a* generally comprises a number of inverters 180*a*–180*n* and a number of inverters 182*a*–182*n*. The number of inverters 180*a*–180*n* and the number of inverters 182*a*–182*n* are generally configured in a series. The series configuration may be configured such that an output of the inverter 182(n–1) may be connected to an input of the inverter 180*n*.

The delay block 160*a* may have a number of outputs 161*a*–161*n* that may present the various bits of the signal PHa. For example, the inverter 180*a* and 180*b*–180*n* may be implemented to present the signal PH_011. The output of the inverter 182*a* (e.g., the signal PH_011) may be presented to an input of the inverter 180*b*. The inverters 180*b* and 182*b* may be used to present the signal PH_010. The remainder of the inverters 180*a*–180*n* and 182*a*–182*n* may provide a similar delay for the additional signals PH_000–PH_111 at the outputs 161*a*–161*n*. The signals PH_000–PH_111 may be implemented to provide a phase delay of the reference clock REF_CLK. The inverters 180*a*–180*n* each may have similar loads. The output loads of the inverters 182*a*–182*n* may be required to match.

Figure 5:
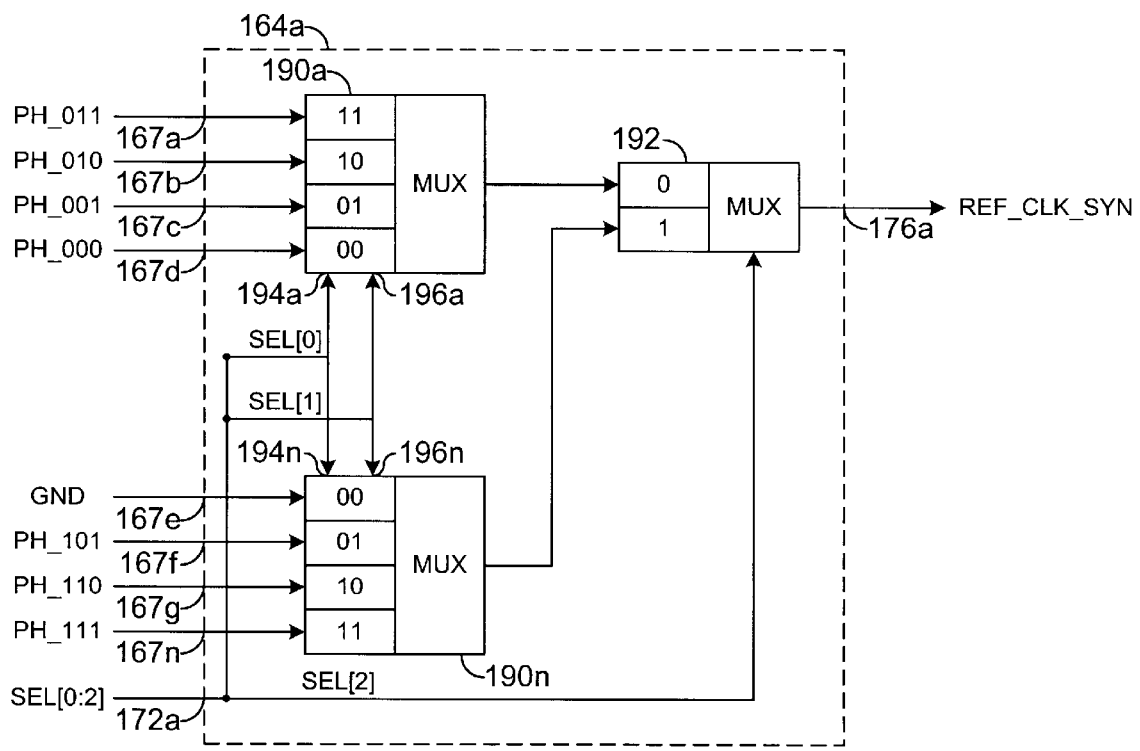
FIG. 5 is a detailed block diagram of a multiplexer logic block of FIG. 3.

Referring to FIG. 5, a detailed block diagram of the multiplexer logic block 164*a* is shown. The multiplexer logic block 164*a* may comprise a number of multiplexers 190*a*–190*n* and a multiplexer 192. The multiplexer 190*a* may have a number of inputs 167*a*–167*d* that may receive the signals PH_000–PH_011. The multiplexer 190*n* may have an input 167*e* that may receive a ground potential and a number of inputs 167*f*–167*n* that may receive the signals PH_101_PH_111. A single bit (e.g., SEL[0]) of the signal SEL[0:2] may be presented to a number of inputs 194*a*–194*n* of the multiplexers 190*a*–190*n*. A single bit (e.g., SEL[1]) of the signal SEL[0:2] may be presented to an input 196*a*–196*n* of the multiplexers 190*a*–190*n*. One of the phase inputs (PH_100) to the multiplexer 190*a* is generally grounded. In one implementation, the select signal SEL[0:2] may not be allowed to equal 100. A state machine (to be discussed in connection with FIG. 6) may automatically correct the phase to PH_000.

The multiplexer logic block 164*a* may be implemented as, in one example, a three level multiplexer. A particular phase selection (the signal PH_000–PH_111) is generally provided by the three level multiplexer block 164*a*. The three level multiplexer block 164*a* may be controlled by the signal SEL[0:2]. The three level multiplexer block 164*a* may be laid out as a cell for matching a delay when a number of such multiplexers (190*a*–190*n*) are implemented next to each other.

After a reset, a center phase (the phase signal PH_000), is generally selected. The signal SEL[0:2] and the signal UPDATE[0:2] generally cause the phase to move upward and downward (to be discussed in connection with FIG. 6) with respect to the diagram.

Figure 6:
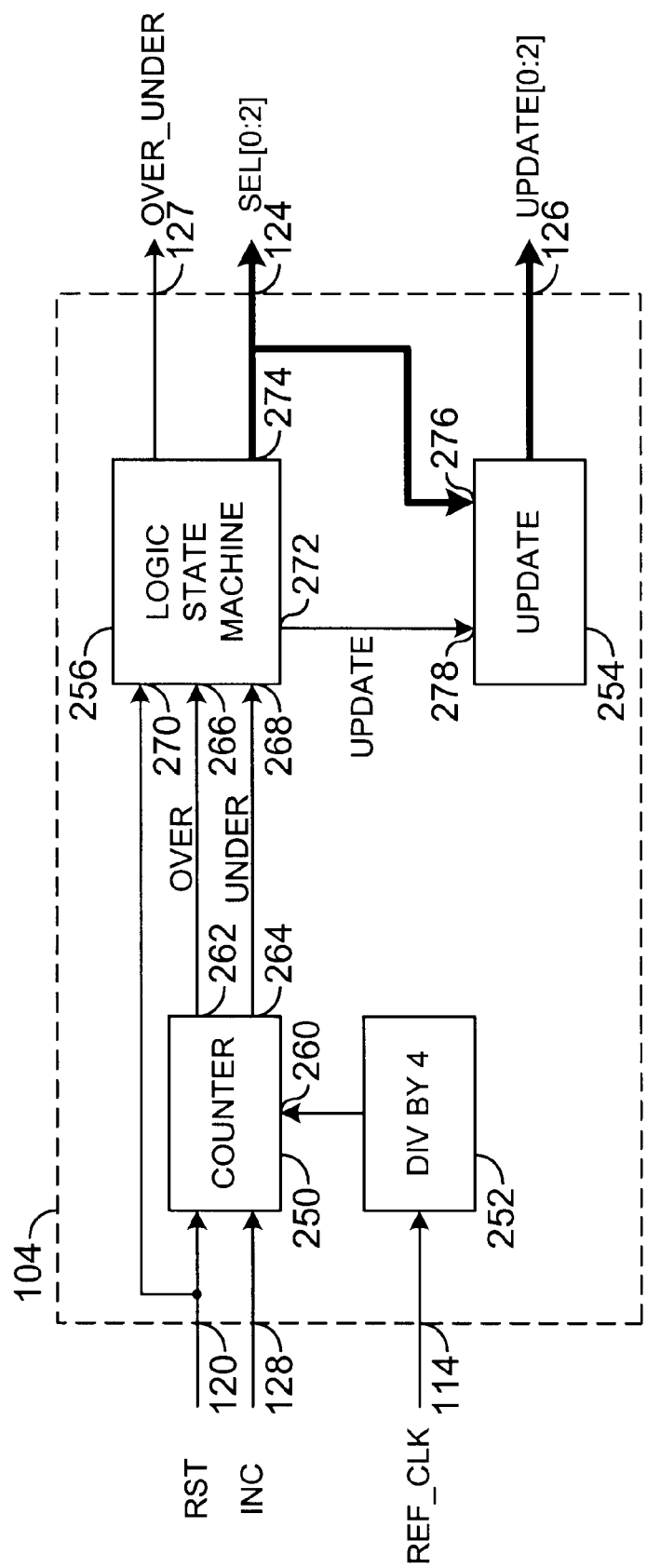
FIG. 6 is a detailed block diagram of a control logic circuit of FIG. 2.

Referring to FIG. 6, a detailed diagram of the control logic circuit 104 is shown. The control logic circuit 104 generally comprises a counter 250, a divider 252, an update block 254 and a state machine 256. The divider 252 generally presents a signal to an input 260 of the counter 250. The counter 250 and the update block 254 may be implemented, in one example, as an up/down counter and a latch, respectively.

The counter 250 may have an output 262 that may present a signal (e.g., OVER) and an output 264 that may present a signal (e.g., UNDER). The state machine 256 may have an input 266 that may receive the signal OVER, an input 268 that may receive the signal UNDER and an input 270 that may receive the signal RST. Additionally, the state machine 256 may have an output 272 that may present a signal (e.g., UPDATE), an output 274 that may present the signal SEL [0:2] and an output 275 that may present the signal OVER_UNDER. The signal UPDATE may be implemented as, in one example, a multi-bit signal or as a single-bit signal.

The signal SEL[0:2] may also be presented to an input 276 of the latch 254. The latch 254 may also have an input 278 that may receive the bit signal UPDATE. The latch 254 may present the signal UPDATE[0:2] in response to the bit signal UPDATE and the select signal SEL[0:2]. In one example, the latch 254 may be implemented as an update latch, the frequency divider 252 may be implemented, and the counter 250 may be implemented as an up/down counter. However, the counter 250, the frequency divider 252 and the latch 254 may each be implemented as an appropriate type device in order to meet the criteria of a particular implementation (e.g., as a divide by 4 counter). The up/down counter 250 may have a direction that may be controlled by the increment signal INC.

The counter 250 may generate the signal OVER and the signal UNDER in response to the signal RST and the signal INC. In one example, the signal OVER may be implemented as an overflow signal. The signal UNDER may be implemented as an underflow signal. The signals OVER, UNDER and RST may control the state machine 256. An example operation of the state machine 256 is shown in the following TABLE 1:

TABLE 1

| RST | PRE_OVER | PRE_UNDER | OVER | UNDER | UPDATE |
|---|---|---|---|---|---|
| 1 | 0 | 0 | 0 | 0 | 0 |
| 0 | 0 | 0 | 0 | 1 | 0 |
| 0 | 0 | 0 | 1 | 0 | 0 |
| 0 | 0 | 0 | 1 | 1 | 0 |
| 0 | 0 | 1 | 0 | 0 | 0 |
| 0 | 0 | 1 | 0 | 1 | 1 |
| 0 | 0 | 1 | 1 | 0 | 0 |
| 0 | 0 | 1 | 1 | 1 | 1 |
| 0 | 1 | 0 | 0 | 0 | 0 |

TABLE 1-continued

| RST | PRE_OVER | PRE_UNDER | OVER | UNDER | UPDATE |
|---|---|---|---|---|---|
| 0 | 1 | 0 | 0 | 1 | 0 |
| 0 | 1 | 0 | 1 | 0 | 1 |
| 0 | 1 | 0 | 1 | 1 | 1 |
| 0 | 1 | 1 | 0 | 0 | 0 |
| 0 | 1 | 1 | 0 | 1 | 1 |
| 0 | 1 | 1 | 1 | 0 | 1 |
| 0 | 1 | 1 | 1 | 1 | 1 |

The bit signal UPDATE may enable the signal SEL[0:2] to be latched and output as the signal UPDATE[0:2]. Otherwise the bit signal UPDATE generally remains low. The bit signal UPDATE is generally asserted only if the current and the previous state (PRE_OVER or PRE_UNDER) of either the under flow signal UNDER or the over flow signal OVER are the same.

The circuit 100 may align a clock phase (via phases PH_000–PH_111) of the reference clock REF_CLK and the transmit clock TX_CLK. The aligned clocks are generally presented as the signal REF_CLK_SYN and the signal TX_CLK_SYN. The skew between the signal REF_CLK_SYN and TX_CLK_SYN may be matched to within a predetermined design parameter, such as 100ps. The signal TX_CLK_SYN is not generally required in the feedback loop (e.g., the circuit 102). The phase of the signal TX_CLK_SYN is not generally constantly updated as the signal in the loop TX_CLK_FB. The select signal SEL [0:2] logic function is shown in the following TABLE 2:

TABLE 2

| RST | OVER | UNDER | PRE_SEL[2] | PRE_SEL[1] | PRE_SEL[0] | SEL[2] | SEL[1] | SEL[0] | OVER_UNDER |
|---|---|---|---|---|---|---|---|---|---|
| 1 | X | X | X | X | X | 0 | 0 | 0 | 0 |
| 0 | 1 | 0 | 0 | 0 | 0 | 0 | 0 | 1 | 0 |
| 0 | 0 | 1 | 0 | 0 | 0 | 1 | 0 | 1 | 0 |
| 0 | 1 | 0 | 0 | 0 | 1 | 0 | 1 | 0 | 0 |
| 0 | 0 | 1 | 0 | 0 | 1 | 0 | 0 | 0 | 0 |
| 0 | 1 | 0 | 0 | 1 | 0 | 0 | 1 | 1 | 0 |
| 0 | 0 | 1 | 0 | 1 | 0 | 0 | 0 | 1 | 0 |
| 0 | 1 | 0 | 0 | 1 | 1 | 0 | 1 | 1 | 1 |
| 0 | 0 | 1 | 0 | 1 | 1 | 0 | 1 | 0 | 0 |
| 0 | 1 | 0 | 1 | 0 | 0 | 0 | 0 | 1 | 0 |
| 0 | 0 | 1 | 1 | 0 | 0 | 1 | 0 | 1 | 0 |
| 0 | 1 | 0 | 1 | 0 | 1 | 0 | 0 | 0 | 0 |
| 0 | 0 | 1 | 1 | 0 | 1 | 1 | 1 | 0 | 0 |
| 0 | 1 | 0 | 1 | 1 | 0 | 1 | 0 | 1 | 0 |
| 0 | 0 | 1 | 1 | 1 | 0 | 1 | 1 | 1 | 0 |
| 0 | 1 | 0 | 1 | 1 | 1 | 1 | 1 | 0 | 0 |
| 0 | 0 | 1 | 1 | 1 | 1 | 1 | 1 | 1 | 1 |

The state machine 256 may receive the signals RST, OVER, UNDER as inputs. Additionally, a signal (e.g., PRE_SEL[0:2] internal to the state machine 256) may be implemented to control the select signal SEL[0:2]. Upon a reset of the signal RST, the multi-bit signal SEL[0:2] may be cleared to a low logic state (e.g., "0"). If the signal OVER is asserted (e.g., "1"), selection of the clock phase (PH_000–PH_111) may follow a sequence (as shown in FIG. 4): PH_000, PH_101, PH_110, and PH_111. If the signal UNDER is asserted (e.g., "1"), selection of the clock phase (PH_000–PH_111) may follow a sequence: PH_000, PH_001, PH_010, and PH_011. In one example, the signal OVER_UNDER may be implemented as an error indicating signals. The signal OVER_UNDER may indicate an error when the clock logic 102 requests a phase step beyond a present range (e.g., under the phase signal PH_011 or over the phase signal PH_111).

The various signals are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

Once "locked", the signal TX_CLK_SYN is generally stationary, while the signal TX_CLK_FB is generally switching back and forth by only one count of the select address in response to the select signal SEL[0:2]. A phase of the signal X_CLK_SYN may update to a phase of the signal TX_CLK_FB when the signal UPDATE is generally asserted.

The circuit 100 may provide simple and purely digital logic design. The circuit 100 may shift the phase of the signal REF_CLK by metal fuses or programmable registers. Additionally, the circuit 100 may offer a way to change the data setup and/or hold time in high speed communication systems. In one example, the circuit 100 may provide a digital phase alignment system.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   an up/down counter configured to present a first control signal indicating an overflow and a second control signal indicating an underflow in response to a reset signal and a third control signal;
   a state machine configured to generate a select signal in response to (i) said reset signal, (ii) said first control signal and (iii) said second control signal; and
   an update circuit configured to generate a fourth control signal in response to said select signal.

2. The circuit according to claim 1, wherein said state machine is further configured to generate an error indication signal.

3. The circuit according to claim 1, wherein said counter comprises an up/down counter.

4. The circuit according to claim 1, wherein said update circuit comprises an update latch.

5. The circuit according to claim 3, wherein said third control signal comprises an increment signal.

6. The circuit according to claim 2, further comprising a divider configured to control said up/down counter in response to a clock.

7. The circuit according to claim 6, wherein said clock comprises a reference clock and said divider comprises a divide by 4 counter.

8. The circuit according to claim 6, wherein said update circuit is further configured to generate said fourth control signal in response to a fifth control signal, wherein said fourth control signal comprises a multi-bit update signal and said fifth control signal comprises a bit update signal.

9. The circuit according to claim 8, wherein said state machine is further configured to generate said fifth control signal.

10. The circuit according to claim 8, wherein said select signal comprises a multi-bit select signal.

11. A circuit comprising:
    means for presenting a first control signal indicating an underflow and a second control signal indicating an underflow in response to a reset signal and a third control signal;
    means for generating a select signal in response to (i) said reset signal, (ii) said first control signal and (iii) said third control signal; and
    means for generating a fourth control signal in response to said select signal.

12. A method for generating an update signal comprising the steps of:
    (A) presenting a first control signal indicating an overflow and a second control signal indicating an underflow in response to a reset signal and a third control signal;
    (B) generating a select signal in response to (i) said reset signal, (ii) said first control signal and (iii) said third control signal;
    (C) generating a fourth control signal in response to said select signal; and
    (D) generating an error indication signal.

13. The method according to claim 12, wherein said third control signal comprises an increment signal.

14. The method according to claim 12, wherein step (A) further comprises controlling said counter in response to a clock.

15. The method according to claim 12, wherein step (C) generates said fourth control signal in further response to a fifth control signal.

16. The method according to claim 15, wherein said fourth control signal comprises a multi-bit update signal and said fifth control signal comprises a bit update signal.

17. The method according to claim 16, wherein said select signal comprises a multi-bit select signal.

18. A circuit comprising:
    a counter configured to present a first control signal and a second control signal in response to a reset signal and a third control signal;
    a state machine configured to generate (i) a select signal and (ii) an error indication signal in response to (i) said reset signal, (ii) said first control signal and (iii) said second control signal;
    an update circuit configured to generate a fourth control signal in response to said select signal; and
    a divider configured to control said counter in response to a clock.

19. The circuit according to claim 18, wherein said first control signal indicates an over flow signal and said second control signal indicates an under flow signal.

20. A method for generating an update signal comprising the steps of:
    (A) presenting a first control signal and a second control signal in response to (i) a reset signal, (ii) a third control signal and (iii) a clock;
    (B) generating a select signal in response to (i) said reset signal, (ii) said first control signal and (iii) said third control signal;
    (C) generating a fourth control signal in response to said select signal; and
    (D) generating an error indication signal.

* * * * *